United States Patent
Huang et al.

(10) Patent No.: US 11,044,832 B2
(45) Date of Patent: Jun. 22, 2021

(54) WATER-COOLED DISTRIBUTIVE HEAT DISSIPATION SYSTEM FOR RACK

(71) Applicant: TAIWAN MICROLOOPS CORP., New Taipei (TW)

(72) Inventors: Yen-Chia Huang, New Taipei (TW); Chun-Hung Lin, New Taipei (TW)

(73) Assignee: TAIWAN MICROLOOPS CORP., New Taipei (TW)

( * ) Notice: Subject to any disclaimer, the term of this patent is extended or adjusted under 35 U.S.C. 154(b) by 0 days.

(21) Appl. No.: 16/655,184

(22) Filed: Oct. 16, 2019

(65) Prior Publication Data
US 2020/0253088 A1 Aug. 6, 2020

(30) Foreign Application Priority Data
Feb. 1, 2019 (TW) .................... 108104276

(51) Int. Cl.
*H05K 7/20* (2006.01)
(52) U.S. Cl.
CPC ..... *H05K 7/20763* (2013.01); *H05K 7/20272* (2013.01)
(58) Field of Classification Search
CPC .......... H05K 7/20781; H05K 7/20981; H05K 7/20636; H05K 7/20645; H05K 7/20272; H05K 7/20254; H05K 7/20281
See application file for complete search history.

(56) References Cited

U.S. PATENT DOCUMENTS

| | | | | |
|---|---|---|---|---|
| 3,242,379 A * | 3/1966 | Smith | ..................... | H01J 13/32 315/113 |
| 7,318,322 B2 * | 1/2008 | Ota | ..................... | H05K 7/20781 62/259.2 |
| 7,599,184 B2 * | 10/2009 | Upadhya | ............. | H05K 7/20727 165/104.33 |
| 9,883,616 B2 * | 1/2018 | Chainer | ............. | H05K 7/20272 |
| 10,201,116 B1 * | 2/2019 | Ross | ..................... | H05K 7/2079 |
| 2014/0060799 A1 * | 3/2014 | Eckberg | ............. | G05D 23/1932 165/287 |
| 2019/0320548 A1 * | 10/2019 | Gao | ..................... | H05K 7/1488 |

FOREIGN PATENT DOCUMENTS

| CN | 207836045 U | 9/2018 |
|---|---|---|
| TW | M346849 U | 12/2008 |

OTHER PUBLICATIONS

Office Action dated Jul. 17, 2019 of the corresponding Taiwan patent application.

* cited by examiner

*Primary Examiner* — Mukundbhai G Patel
(74) *Attorney, Agent, or Firm* — Chun-Ming Shih; HDLS IPR Services

(57) ABSTRACT

A water-cooled pressurized distributive heat dissipation system includes a water tank having a distributing duct, branch modules separately corresponding to the servers and a converging duct. Each branch module has a branch pipe inserted into a corresponding one of the servers and a water block connecting to the branch pipe. An end of each of the branch pipe connects to the distributing duct in order. The converging duct connects to another end of each branch pipe in order. A working fluid is accommodated in the water tank and driven by a pump to flow toward the distributing duct to the branch modules and the converging duct. A flow direction of the working fluid in the distributing duct is the same as a flow direction of the working fluid in the converging duct.

5 Claims, 3 Drawing Sheets

WATER-COOLED DISTRIBUTIVE HEAT DISSIPATION SYSTEM FOR RACK

BACKGROUND OF THE INVENTION

Technical Field

The invention relates to heat dissipation systems for servers, particularly to a water-cooled distributive heat dissipation system for a rack.

Related Art

A conventional water-cooled heat dissipation system applied in a rack for servers uses a master pump to drive working fluid to separately flow into water blocks on corresponding heat sources of servers by flow distribution. Although a water-cooling effect can be accomplished, flow of the working fluid tends to be affected because of different lengths of pipelines. For example, the longer the length of a pipeline is, the lower the flow of the working fluid is.

However, unavoidably, servers mounted in a rack are usually arranged in a vertical or superpositional direction, so a distance between the top one and the bottom one is the longest than others. Thus, these two servers with the longest distance, which are connected by the abovementioned pipeline, must only obtain less flow of the working fluid than others. This causes an uneven effect of heat dissipation or cooling. If a larger pump is used to satisfy the lowest effect of heat dissipation or cooling, then the costs will be increased. This is a problem to be solved.

SUMMARY OF THE INVENTION

An object of the invention is to provide a water-cooled distributive heat dissipation system for a rack, which uses a flow distribution approach to equalize all branch paths to implement an effect of even flow.

Another object of the invention is to provide a water-cooled distributive heat dissipation system for a rack, which can use pumps with less power because of flow distribution.

To accomplish the above objects, the invention provides a water-cooled distributive heat dissipation system, which is used for dissipating heat of servers in the rack, wherein the servers are fixed in the rack in a ranging direction. The system includes a water tank having a distributing duct, branch modules separately corresponding to the servers and a converging duct. Each branch module has a branch pipe inserted into a corresponding one of the servers and a water block connecting to the branch pipe. An end of each of the branch pipe connecting to the distributing duct in order. The converging duct connects to another end of each branch pipe in order. A working fluid is accommodated in the water tank and driven by a pump to flow toward the distributing duct to the branch modules and the converging duct. A flow direction of the working fluid in the distributing duct is the same as a flow direction of the working fluid in the converging duct.

To accomplish the above objects, the invention provides a water-cooled distributive heat dissipation system further including another distributing duct, another converging duct and branch modules connected between the another distributing duct and the another distributing duct, wherein the another distributing duct connects to the another distributing duct.

DETAILED DESCRIPTION OF THE INVENTION

Figure 1:
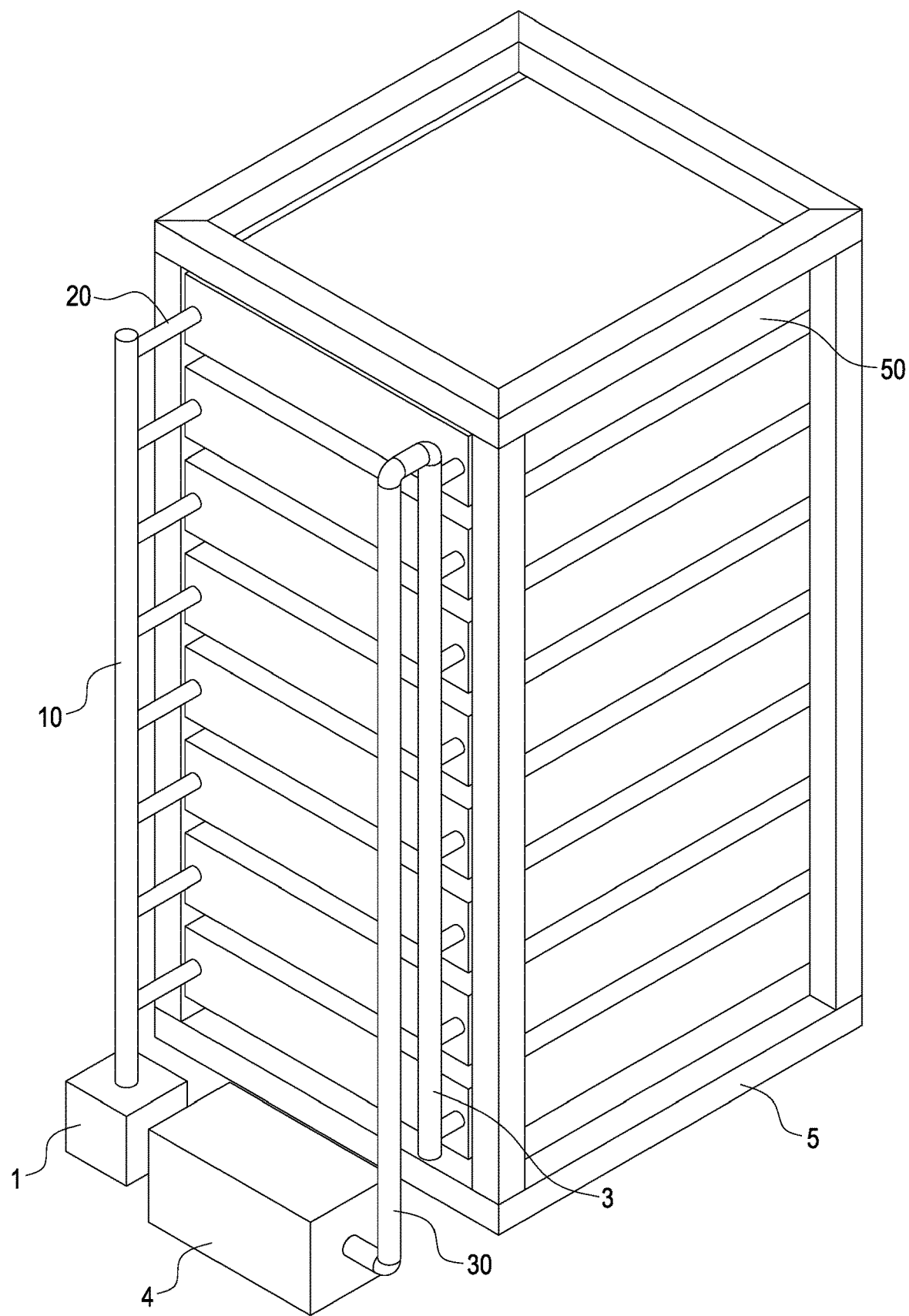
FIG. 1 is a schematic view of the invention applied to a rack.
Figure 2:
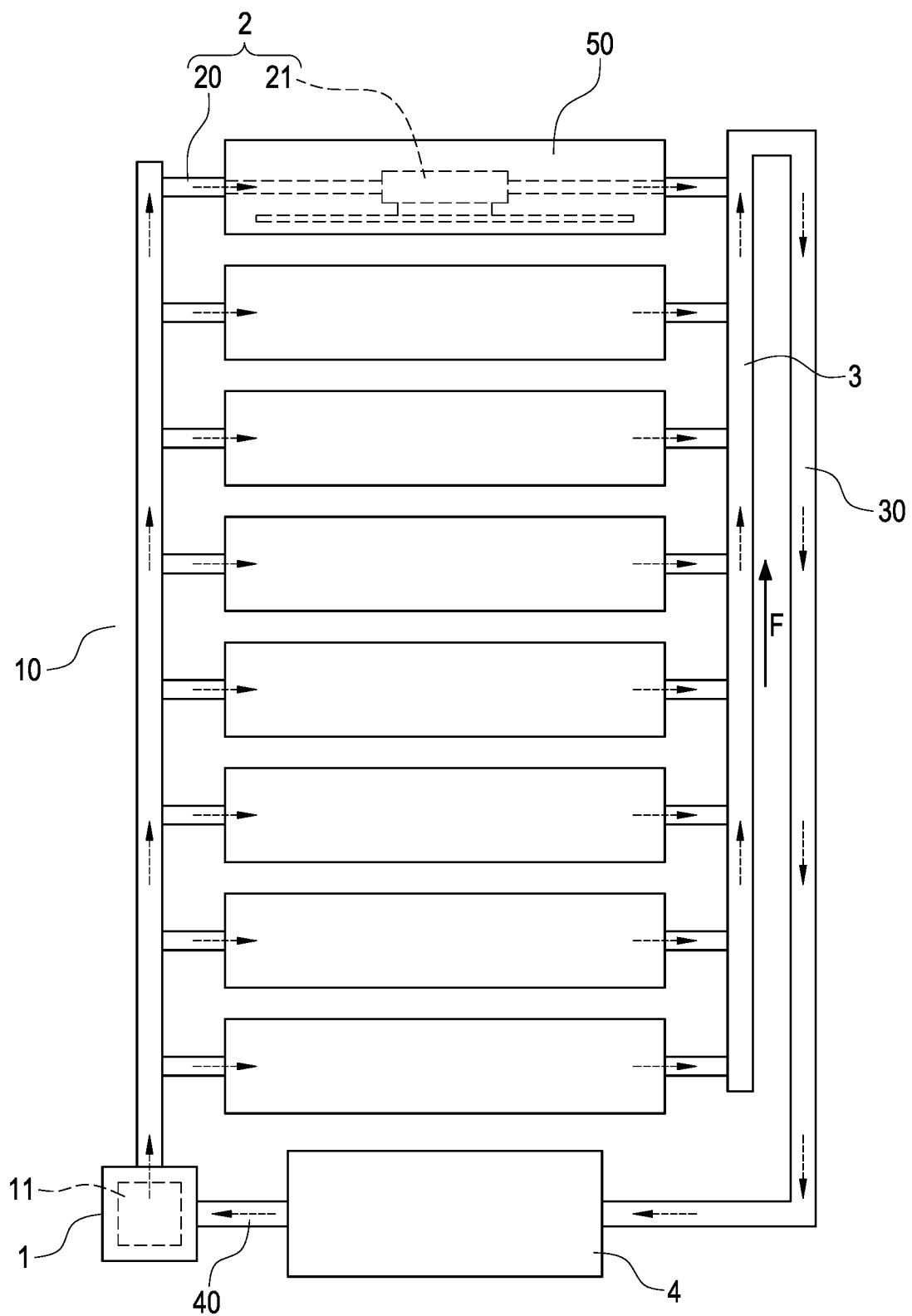
FIG. 2 is a schematic plan view of the first embodiment of the invention.

Please refer to FIGS. 1 and 2, which are a schematic view of the invention applied to a rack and a schematic plan view of the first embodiment of the invention, respectively. The invention provides a water-cooled pressurized distributive heat dissipation system for a rack, which is used for dissipating heat of servers 50 in the rack 5, wherein the servers 50 are fixed in the rack 5 in a ranging direction F. Usually, the ranging direction is a vertical or superpositional direction. The water-cooled heat dissipation system includes a water tank 1, branch modules 2 and a converging duct 3.

The water tank 1 may be disposed outside the rack 1 and holds a working fluid for heat dissipation or cooling, such as water. A distributing duct 10 is connected to the water tank 1. The working fluid in the water tank 1 can be driven by a pump 11 to flow into the servers 50 in the rack 50 through the distributing duct 10 for dissipating heat from heat sources in the servers 50.

The branch modules 2 separately correspond to the servers 50, each of which has a branch pipe 20 inserted into a corresponding one of the servers 50 and at least one water block 21 connecting to each branch pipe 20. An end of each of the branch pipes 20 connects to the distributing duct 10 in the ranging direction F. As shown in FIG. 2, in this embodiment, each server 50 is correspondingly disposed with at least one water block 21. After the water block 21 is connected with the branch pipe 20, the working fluid can be conveyed from the water tank 1 to the water blocks 21 through the distributing duct 10 to dissipate heat from heat sources in the servers 50.

The converging duct 3 is disposed outside the servers 50 and connects to another end of each of the branch pipes 2 in the ranging direction F. Meanwhile, because the working fluid in the water tank 1 is driven by the pump 11 to flow to both the branch modules 2 and the converging duct 3 through the distributing duct 10 and a flow direction of the working fluid in the distributing duct 10 is the same as a flow direction of the working fluid in the converging duct 3, all paths between the distributing duct 10 and the converging duct 3 are substantially equal regardless of any one of the branch modules 2 or the servers 50 the working fluid flows through.

In detail, please refer to FIG. 2, because a flow direction of the working fluid in the distributing duct 10 is consistent with a flow direction of the working fluid in the converging duct 3 and the branch modules 2 are arranged between the distributing duct 2 and the converging duct 3 in the ranging direction F, the horizontal lengths the working fluid flows through the branch modules 2 or the servers 50 are equal regardless of any one of the branch modules 2 or the servers 50 the working fluid flows through. For example, for the branch modules or the servers 50 at a lower position in the ranging direction F, the shorter the length the working fluid flows through the distributing duct 10 is, the longer the length the working fluid flows through the converging duct 3 is. Contrarily, for the branch modules or the servers 50 at a higher position in the ranging direction F, the longer the length the working fluid flows through the distributing duct 10 is, the shorter the length the working fluid flows through the converging duct 3 is. The total length is substantially equal to the length of the distributing duct 10 or the converging duct 3.

In addition, the invention may be further provided with a cooling device 4 between the water tank 1 and an output end of the converging duct 3 to cool the working fluid in the converging duct 3. A connecting pipe 40 is connected between the water tank 40 and the cooling device 4 to form a circulating pipeline so as to make the working fluid circulate in the circulating pipeline. To consider arrangement of disposal, a bent pipe can be connected between the output end of the converging duct 3 and the cooling device 4 for downward bendingly extending the output end of the converging duct 3 to the cooling device 4 at a bottom position.

Figure 3:
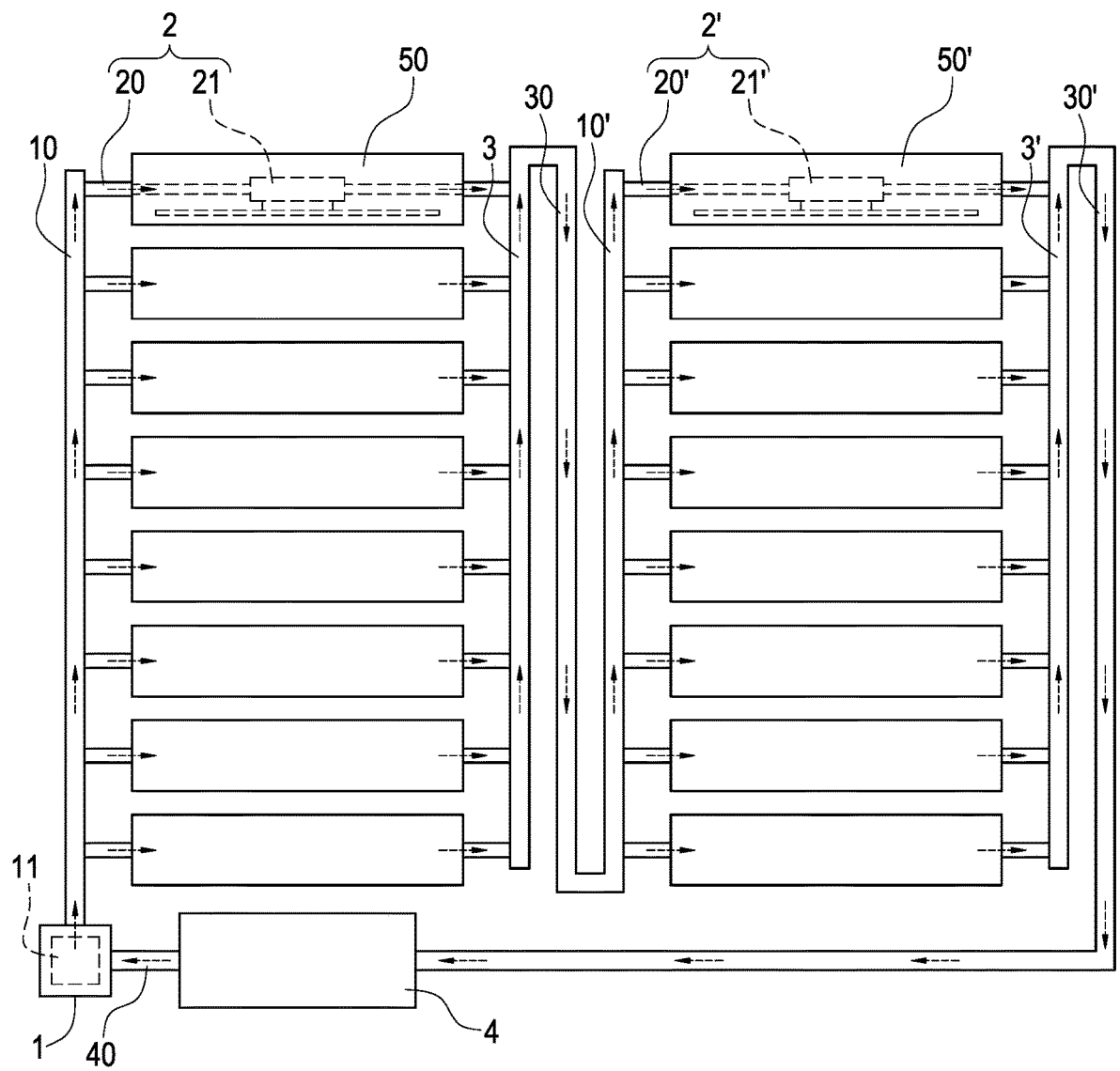
FIG. 3 is a schematic plan view of the second embodiment of the invention.

FIG. 3 is a schematic plan view of the second embodiment of the invention. The invention can connect servers 50, 50' in two racks to form a circulating cooling pipeline. The converging duct 3 of the first rack 1 is connected to another distributing duct 10' of the second rack. The distributing duct 10' further provides branch modules 20' for cooling additional servers 50. Identically, each of the branch modules 20' has a branch pump 20' and at least one water block 21' in a corresponding one of the servers 50'. A converging duct 3' is connect to the water blocks 21' of the branch modules 2'. The working fluid is converged to the cooling device 4 to make circulation through the circulating pipeline.

It will be appreciated by persons skilled in the art that the above embodiments have been described by way of example only and not in any limitative sense, and that various alterations and modifications are possible without departure from the scope of the disclosed example as defined by the appended claims.

What is claimed is:

1. A water-cooled distributive heat dissipation system for a rack, which is used for dissipating heat of servers in the rack, wherein the servers are fixed in the rack in a ranging direction, comprising:
a water tank having a distributing duct;
branch modules, separately corresponding to the servers, each having at least one branch pipe inserted into a corresponding one of the servers and a water block connecting to the branch pipe, and an end of each of the branch pipe connecting to the distributing duct in the ranging direction; and
a converging duct connecting to another end of each branch pipe in the ranging direction;
a cooling device disposed on a bottom position of the water-cooled distributive heat dissipation system, and connected to the water tank; and
a bent pipe, connected between the output end of the converging duct and the cooling device, and comprising a curved portion and a linear portion, wherein the curved portion is connected between the output end of the converging duct and the linear portion, the linear portion is connected between the curved portion and the cooling device;
wherein a working fluid is accommodated in the water tank and driven by a pump to flow toward the distributing duct to the branch modules and the converging duct, and a flow direction of the working fluid in the distributing duct is the same as a flow direction of the working fluid in the converging duct,
a flow direction of the working fluid in the linear portion of the bent pipe is opposite to the flow direction of the working fluid in the converging duct and the flow direction of the working fluid in the distributing duct, and
a total path length in the distributing duct and the converging duct of the working fluid, which is flowing through any one of the branch modules, is substantially equal to a length of the distributing duct or a length of the converging duct.

2. The water-cooled distributive heat dissipation system of claim 1, wherein a connecting pipe is connected between the water tank and the cooling device.

3. The water-cooled distributive heat dissipation system of claim 1, wherein the water block of each branch module is multiple in number.

4. The water-cooled distributive heat dissipation system of claim 1, further comprising another distributing duct, another converging duct and branch modules connected between the another distributing duct and the another distributing duct, wherein the converging duct connects to the another distributing duct.

5. The water-cooled distributive heat dissipation system of claim 4, wherein the water block of each branch module is multiple in number.

* * * * *